United States Patent [19]

Farber et al.

[11] Patent Number: 5,496,685
[45] Date of Patent: Mar. 5, 1996

[54] PHOTOSENSITIVE COMPOSITIONS AND ELEMENTS FOR FLEXOGRAPHIC PRINTING

[75] Inventors: Milton Farber, Cheshire, Conn.; David T. Hughes, Kennedale, Tex.

[73] Assignee: Chase Elastomer Corporation, Kennedale, Tex.

[21] Appl. No.: 122,682

[22] Filed: Sep. 17, 1993

[51] Int. Cl.$^6$ .................... G03F 7/00; G03F 7/038
[52] U.S. Cl. ............... 430/306; 430/281.1; 430/286.1; 430/309
[58] Field of Search .............. 430/306, 281, 430/286, 309

[56] References Cited

U.S. PATENT DOCUMENTS

| | | | |
|---|---|---|---|
| 3,239,478 | 3/1966 | Harlan, Jr. | 260/27 |
| 3,265,765 | 8/1966 | Holden et al. | 260/876 |
| 4,014,771 | 3/1977 | Rosenkranz et al. | 204/159.23 |
| 4,198,241 | 4/1980 | Bronstert et al. | 430/306 |
| 4,243,740 | 1/1981 | Tsuda et al. | 430/270 |
| 4,267,258 | 5/1981 | Yoneda et al. | 430/270 |
| 4,292,150 | 9/1981 | Farber et al. | 204/159.12 |
| 4,323,636 | 4/1982 | Chen | 430/271 |
| 4,323,637 | 4/1982 | Chen et al. | 430/271 |
| 4,382,120 | 5/1983 | Reichmanis et al. | 430/272 |
| 4,391,949 | 7/1983 | St. Clair | 525/99 |
| 4,508,802 | 4/1985 | Heiart et al. | 430/22 |
| 4,518,677 | 5/1985 | Pohl | 430/306 |
| 4,707,432 | 11/1987 | Gatechair et al. | 430/281 |
| 4,725,528 | 2/1988 | Koch et al. | 430/309 |
| 4,831,177 | 5/1989 | Kirchmayr et al. | 558/52 |
| 4,894,315 | 1/1990 | Feinberg et al. | 430/281 |
| 4,917,990 | 4/1990 | Herrmann | 430/286 |
| 4,960,746 | 10/1990 | Hüsler et al. | 502/153 |
| 5,039,592 | 8/1991 | Umeda | 430/271 |
| 5,041,360 | 8/1991 | Schlosser | 430/309 |
| 5,104,921 | 4/1992 | Erickson et al. | 524/274 |
| 5,192,642 | 3/1993 | Steiner et al. | 430/281 |
| 5,212,049 | 5/1993 | Gersdorf | 430/285 |
| 5,247,026 | 9/1993 | Erickson et al. | 525/331.9 |
| 5,304,458 | 4/1994 | Berrier et al. | 430/281 |
| 5,364,741 | 11/1994 | Huynh-Tran et al. | 430/300 |
| 5,370,968 | 12/1994 | Goss et al. | 430/306 |

FOREIGN PATENT DOCUMENTS

| | | |
|---|---|---|
| 1267475 | 4/1990 | Canada. |
| 0465034A1 | 1/1992 | European Pat. Off.. |
| 0553662A1 | 8/1993 | European Pat. Off.. |

OTHER PUBLICATIONS

Thomas, Richard W., "UV Stabilization of Elastomeric Materials" May, 1993 143rd Meeting Rubber Division American Chemical Society.

Database WPI, Section Ch, Week 8819, Derwent Publications Ltd., London, GB; Class A89, AN 88–128571 and JP, A, 63 070 242 (Nippon Zeon KK), 30 Mar. 1988, see Abstract.

*Primary Examiner*—Janis L. Dote
*Attorney, Agent, or Firm*—Charles D. Gunter, Jr.; Susan L. Firestone

[57] ABSTRACT

The invention relates to the use of effective amounts of UV absorbers in a thermoplastic, elastomeric, composition layer of a photosensitive printing element, wherein said layer comprises a thermoplastic, elastomeric, asymmetric, star-shaped block copolymer, to produce enhanced exposure latitude, as well as a method of producing a printing plate with the printing element. The UV absorbers most likely act as internal scavengers of scattered UV light and thereby enhance the exposure latitude of the printing element. The invention also relates to the photosensitive composition of the element.

2 Claims, No Drawings

PHOTOSENSITIVE COMPOSITIONS AND ELEMENTS FOR FLEXOGRAPHIC PRINTING

BACKGROUND OF THE INVENTION

1. Field of the Invention

The invention relates to a photosensitive elastomer composition having enhanced exposure latitude by using actinic radiation absorbers that are distributed evenly throughout the photosensitive elastomer composition. The invention also relates to a printing element formed from the photosensitive elastomer composition and a method of forming the printing element.

2. Description of the Prior Art

Photosensitive printing elements used for flexographic printing crosslink or "harden" and become insoluble upon exposure to actinic radiation or light. Generally, a template, such as a photographic negative or transparency is put onto an unexposed plate containing a layer of photosensitive material. The plate is then exposed to actinic radiation, such as UV or black light, close to the plate. The actinic radiation enters the photosensitive material through the transparent regions as divergent beams of light and irradiates a continually diverging area in the material underneath the clear areas of the transparency. The exposed material crosslinks and becomes insoluble to solvents used during the development of the image on the plate. The crosslinked material has its greatest width at the bottom of the photosensitive layer, thus forming a frustum, while the top surface is the same size as the template. Unexposed areas remain uncrosslinked and are washed away with a suitable solvent, thus producing a final plate as a relief, an intaglio or a combination of both. Then the plate is dried. The washed printing plate can be further treated to remove surface tackiness and exposed to additional actinic radiation to ensure complete photopolymerization and crosslinking. After these steps, the plate is ready to be mounted on a cylinder and used for printing.

Good flexographic printing plate physical properties include softness, flexibility, resilience and durability. These properties affect print quality. Plates should print with a "kiss" impression under very low impression pressure. That is, they pick up the ink and accurately transfer the image without distortion. Hard plates pick up less ink, transfer the image unevenly and require greater impression pressure. A soft plate is thus preferable to a hard plate.

A problem exists with flexographic plates regarding latitude in the time of exposure to actinic radiation that is addressed by the present invention. The finest relief or above surface detail is best produced by longer exposure times, while the intaglio or below surface detail is favored at shorter times. Flexographic plates are therefore exposed in a variety of ways to ensure proper image development. Unfortunately, it is sometimes necessary to mask off portions of the plate and give them different exposure times, which is both tedious and undesirable. Therefore, one definition of the exposure latitude of a printing plate is its ability to reproduce different types of detail with a single exposure to actinic radiation. For example, a test may measure the finest dots in relief that hold (that is, do not wash away) at a given UV exposure. Loss of such fine relief dots occurs when the dots are underexposed and have little or no shoulder. If not removed during washing due to underexposure, undercutting may occur to yield a pedestal-like structure similar to a mushroom which is also undesirable. Loss of the fine dots or undercutting while the intaglio remains good is one indication of a reduced exposure latitude. Another indication is the filling in of the intaglio image when the exposure is increased to hold the fine dot relief. Optimally, a good exposure latitude might be defined as the ability of the plate to yield acceptable relief and intaglio detail over a wide range of exposure times.

Excessive scattering or irregular reflection of light from the support of the printing element is known as halation and can cause fogging or partial crosslinking of unexposed areas in the photosensitive layer. These "fogged" areas are difficult to dissolve during development, and can produce shallow reliefs that interfere with accurate printing.

In the prior art, actinic radiation absorbing or antihalation layers between the photosensitive layer and the support have been employed to reduce fogging. This layer absorbs light passing through it, whether directly or reflected from the support.

Conventional wisdom in the flexographic printing industry, however, teaches that the light absorbing materials cannot be used within the photosensitive composition of the photosensitive layer and must always be part of a separate layer in the flexographic plate. It was further believed that diffusible absorbers migrating from the antihalation layer into the photosensitive layer would interfere with crosslinking and produce an inferior plate. Absorbers in large amounts added directly to the photosensitive composition would similarly absorb the light essential for crosslinking as it passes through the layer, again producing an inferior plate. In addition, these absorbers could also reduce adhesion of the photosensitive layer with the adhesive used for adhering to a support.

One object of the invention is to produce a photosensitive composition where the speed of crosslinking is controlled and the exposure latitude is enhanced.

Another object of the invention is to produce a photosensitive composition and element for flexographic printing that is desirably soft, yet possesses flexibility, resilience and durability.

SUMMARY OF THE INVENTION

The invention relates to a photosensitive elastomer composition having enhanced exposure latitude by using an actinic radiation absorber distributed evenly throughout it. The photosensitive elastomer composition forms the photosensitive layer of a printing element that is used to produce a printing plate. The photosensitive printing element comprises a photosensitive elastomer composition layer containing a thermoplastic elastomeric block copolymer, a crosslinking photoinitiator and an actinic radiation absorber evenly distributed throughout the composition layer and support means.

The method of making a printing plate from the photosensitive printing element comprises the steps of: a) imagewise exposing with actinic radiation selected areas of a photosensitive composition layer of the photosensitive printing element described above to crosslink the exposed areas of the composition; b) removing the uncrosslinked areas of the layer, c) drying the layer and d) applying a post development treatment.

Additional effects, features and advantages will be apparent in the written description that follows.

DETAILED DESCRIPTION OF THE INVENTION

The photosensitive compositions of the invention produce improved printing elements that have a practical range of photospeed while providing excellent exposure latitude as defined previously.

The improvement in exposure latitude of the present invention is due to the incorporation of effective amounts of materials in the photosensitive composition that absorb actinic radiation. Actinic radiation absorbers are referred to generally as "ultraviolet (UV) absorbers" in this disclosure, although there may be an overlap into the visible spectrum. UV absorbers are known in the rubber, plastics and paint industries. These absorbers typically prevent the deterioration of elastomers, plastics and paints caused by exposure to light. The UV absorbers of the invention are photostable. They strongly absorb ultraviolet light and convert it to heat, rather than forming free radicals which can cause crosslinking, scission and deterioration of the polymer.

UV absorbers of the invention may decrease photospeed, without requiring long exposures. The UV absorbers most likely improve exposure latitude by acting as a scavenger for internally scattered radiation that reduces relief and fills in intaglio. These UV absorbers in an effective amount enable the photopolymer to reproduce a wide range of detail with a single exposure to the actinic radiation, thus enhancing the exposure latitude. They also allow the use of a wider range of exposure times without loss of detail or fill in. The UV absorber(s) is added to the photosensitive composition during the composition's preparation and is evenly distributed throughout the composition. Preferably, the amount of UV absorber used is about 0.001 parts by weight per hundred parts by weight polymer (php) to about 1 php, most preferably about 0.01 php to about 0.5 php. The amount of UV absorber will depend on its UV absorbing efficiency in any particular composition. Inefficient UV absorbers will require greater concentrations than efficient ones. As the attached Examples show, the optimum amount of UV absorber is easily determined by those skilled in the art.

The UV absorber should be compatible with the photosensitive polymer composition, without causing loss of optical clarity or decrease in physical properties. The UV absorbers of the invention preferably absorb in the near-ultraviolet spectrum (about 290 nm to about 400 nm), most preferably, from about 290 nm to about 360 nm. These UV absorbers include benzotriazoles, benzophenones, benzoates, salicylates, substituted acrylonitriles, cyanoacrylates, benzilidene malonates, oxalanilides and mixtures thereof. Useful UV absorbers include 1,2,3-benzotriazole; 2-hydroxy-4-alkoxybenzophenones; phenyl salicylate; t-butylphenyl salicylate; t-octylphenyl salicylate; resorcinol monobenzoate; 2,4-di-t-butylphenyl 3,5-di-t-butyl-4-hydroxybenzoate; n-hexadecyl 3,5-di-t-butyl-4-hydroxybenzoate; 3,5-di-t-butyl p-hydroxybenzoic acid; ethyl-2-cyano-3,3-diphenyl acrylate; 2-ethylhexyl-2-cyano-3,3-diphenyl acrylate; 2-ethyl-2'-ethoxyoxanilide; SANDUVOR EPU (Sandoz Chemicals Corp., Charlotte, N.C.); SANDUVOR VSU (Sandoz); and the like.

Preferred UV absorbers of the invention include:
(a) 2-hydroxyphenyl benzotriazoles of the general structure:

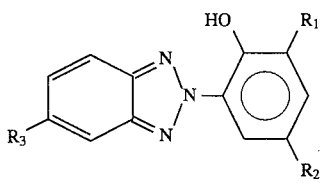

where $R_1$ is hydrogen, alkyl, alkenyl, phenyl, alkylaryl or alkenylaryl; $R_2$ is hydrogen, alkyl, alkenyl, alkylaryl or alkenylaryl and $R_3$ is hydrogen, alkyl, alkenyl, alkylaryl or halogen;

(b) 2-hydroxybenzophenones of the general structure:

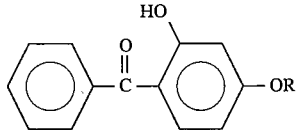

where R is hydrogen, alkyl, alkoxy, acryloyloxyethoxy monomer, or acryloyloxyethoxy polymer and
(c) 2,2'-dihydroxybenzophenones of the general structure:

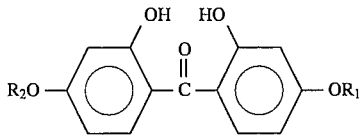

where $R_1$ and $R_2$ are hydrogen or alkyl.

Examples of the preferred UV absorbers include 2-(2'-hydroxyphenyl)benzotriazole; 2-(2-hydroxy-5-methylphenyl)-2H-benzotriazole; 2-(2'-hydroxy-5'-methylphenyl) benzotriazole; 2-(2'-hydroxy-5=-t-octylphenyl) benzotriazole; 2-(2'-hydroxy-3',5'-di-t-butylphenyl) benzotriazole; 2-(2'-hydroxy-3',5'-di-t-amylphenyl) benzotriazole; 2-(2'-hydroxy-3',5'-di-methylstyryl) benzotriazole; α-((3-(3-(2H-benzotriazole-2-yl)-5-(1,1-dimethyl-ethyl)-4-hydroxyphenyl)-1 -oxopropyl)-ω-hydroxy; α-((3-(3-(2H-benzotriazole-2-yl) -5-(1,1-dimethyl-ethyl)-4-hydroxyphenyl)-1-oxopropyl) -ω-(3-(3-(2H-benzotriazole-2-yl)-5-(1,1-dimethyl-ethyl)-4-hydroxyphenyl)-1-oxopropoxy); 2(2'-hydroxy-3',5'-(1,1-dimethylbenzyl phenyl) benzotriazole; 2-(2-hydroxy-5-t-octophenyl) benzotriazole; bis[2-hydroxy-5-t-octyl-3-(benzotriazole-2-yl) phenyl] methane; MARK 446 (Argus Div., Witco Corp. Brooklyn, N.Y.); MARK 446B (Argus); 2-hydroxy-4-n-octoxybenzophenone; 2-hydroxy-4-methoxybenzophenone; 2-hydroxy-4-dodecyloxybenzophenone; 2-hydroxy-4-alkoxybenzophenone; 2,4-dihydroxybenzophenone; 2,2'-dihydroxy-4-methoxybenzophenone; 2,2'-dihydroxy-4,4'-dimethoxybenzophenone; 2,3,4-trihydroxybenzophenone; 2,2',4,4'-tetrahydroxybenzophenone; MARK 1535 (Argus); PERMYL B100 (Ferro Corp., Chemical Div., Bedford, Ohio); CYABSORB UV 2126 (American Cyanamid Co., Wayne, N.J.) and the like, as well as their mixtures. A more preferred UV absorber includes 2,4-dihydroxybenzophenone (SYNTASE 100, Great Lakes Chemical, West Lafayette, Ind.). Most preferred UV absorbers include a mixture of poly(oxy-1,2-ethanediyl), α-(3-(3-(2H-benzotriazol-2-yl)-5-(1,1-dimethylethyl)-4-hydroxyphenyl)-1-oxopropyl)-ω -hydroxy; poly(oxy-1,2-ethanediyl), α-(3-(3-(2H-benzotriazole-2-yl)-5-(1,1-dimethylethyl)-4 -hydroxyphenyl)-1-oxopropyl-ω-(3-(3-(2H-benzotriazol-2-yl)-5-(1,1-dimethylethyl)-4 -hydroxyphenyl)-1-oxopropoxy) and polyethylene glycol (300 Mw) (TINUVIN 1130, Ciba-Geigy Corp., Additives Div., Hawthorne, N.Y.) and 2-(2-hydroxy-5-t-octophenyl) benzotriazole (CYASORB UV5411, American Cyanamid).

The photopolymerizable elastomer of the photosensitive composition can include natural or synthetic linear tri-block copolymers such as polymers of A-B-A type hydrocarbon tri-block copolymers; linear di-block copolymers such as A-B di-block copolymers; symmetric, radial copolymers, such as symmetric A-B multi-branched, block copolymers; asymmetric, star-shaped copolymers such as asymmetric multi-branched, block copolymers having at least one A-B block and a residue of a multifunctional coupling agent between at least one block C and mixtures thereof. The A blocks are predominantly polymerized alkenyl arene blocks, while blocks B and C are predominantly polymerized conjugated diene blocks. A, B and C blocks may be either homopolymer, random or tapered copolymer blocks as long as each block predominates in at least one class of their monomers defined below. The block copolymers of conjugated dienes and alkenyl arene hydrocarbons include any of those that exhibit elastomeric properties. The block copolymers disclosed in U.S. Pat. Nos. 3,265,765; 3,674,486; 4,686,172; 4,343,646; 4,430,417; 4,045,231; 4,391,949; 5,104,921 and Applicant's copending U.S. patent application, Ser. No. 08/122,400, Hughes, D. T. and Farber, M., filed Sep. 17, 1993, and assigned to the assignee of the current invention, as well as Canadian Patent No. 1,267,475, are herein incorporated by reference.

The alkenyl arenes in block A are preferably monoalkenyl arenes. Block A may contain copolymers of two or more alkenyl arenes, for example, styrene/α-methylstyrene copolymer blocks, or alkenyl styrene/conjugated diene random or tapered copolymer blocks as long as the blocks A individually at least predominate in alkenyl arenes, that is, greater than 50% by weight. The alkenyl arene content of block A is preferably from about 80% to 100% by weight, more preferably 100% by weight.

The term "monoalkenyl arene" includes particularly those of the benzene series such as styrene and its analogs and homologs, including α-methylstyrene, t-butylstyrene, o-methylstyrene, p-methylstyrene, p-butylstyrene, 1,3-dimethylstyrene, and other ring alkylated styrenes, particularly ring methylated styrenes, and other monoalkenyl polycyclic aromatic compounds such as vinylnaphthalene, vinylanthracene and the like, as well as mixtures of the same. The preferred monoalkenyl arenes are monovinyl monocyclic arenes such as styrene and α-methylstyrene. Styrene is most preferred.

The B and C polymer blocks of conjugated dienes may include homopolymers of conjugated diene monomers and copolymers of two or more conjugated dienes, and mixtures thereof, as well as copolymers of at least one or more conjugated diene with at least one monoalkenyl arene as long as the conjugated diene predominates. Preferably, the alkenyl arene content of blocks B and C ranges from about 0% to 10% by weight, more preferably 0%.

The conjugated dienes are preferably ones containing from 4 to 8 carbon atoms. Examples of conjugated dienes include 1,3-butadiene (butadiene) and 2-methyl-1,3-butadiene (isoprene) and their homologs and analogs, such as 2,3-dimethyl butadiene; 1,3-pentadiene (piperylene); 1,3-hexadiene; and the like, as well as mixtures thereof. The preferred conjugated dienes are butadiene and isoprene, while isoprene is most preferred.

An especially preferred photopolymerizable elastomer is an asymmetric, star-shaped copolymer disclosed in the above incorporated '949 and '921 patents and U.S. patent application, Ser. No. 08/122,400, filed Sep. 17, 1993. This asymmetric star-shaped, block copolymer has at least one A-B copolymer block and a residue of a multifunctional coupling agent between at least one block C. While the conjugated dienes in block B may differ from that in block C, it is preferred that the same diene is used in both blocks. This block copolymer has the characteristics of a thermoplastic elastomer when the alkenyl arene content is not more than about 60% by weight, preferably not more than about 55% by weight. The multifunctional coupling agent residue is the residue of any coupling agent that has at least two reactive sites and can form star-shaped polymers, although a polyalkenyl aromatic coupling agent is preferred. More preferably, the copolymer is an asymmetric, star-shaped copolymer of the structure:

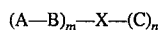

where block A is an alkenyl arene, blocks B and C are conjugated diene blocks, X is the residue of a multifunctional coupling agent, $3 < m+n \leq 40$, the weight average molecular weight of each block A is between about 3,000 and about 125,000 and the molecular weight of each block B and block C is between about 15,000 and about 250,000. Most preferably, the polymer is an asymmetric, star-shaped, styrene-isoprene block copolymer having greater than about 6 arms but fewer than about 40 arms of isoprene ($6 < m+n < 40$), a divinylbenzene residue, a weight average molecular weight of about 1.2 million and a polystyrene content of about 10% by weight. This block copolymer is available from Shell Chemical Co., Houston, Tex., as KRATON® D-1320X rubber.

Photoinitiators activated by actinic radiation can generate free radicals which initiate addition polymerization or crosslinking. These photoinitiators are thermally inactive at or below 185° C. and may include a combination of initiators to form a free radical generating system. Therefore in this disclosure, the term "crosslinking photoinitiator" refers to one photoinitiator or a system of crosslinking and/or addition polymerization photoinitiators that generate free radicals upon actinic radiation exposure. These photoinitiators are well known in the art and include aromatic ketones such as benzophenone and substituted benzophenones, the substituted or unsubstituted polynuclear quinones which are compounds having two intracyclic carbon atoms in a conjugated six-membered carbocyclic ring and having at least one aromatic carbocyclic ring fused to the ring containing the carbonyl groups, and mixtures thereof. Examples of photoinitiators include such suitable initiators as 2,2-dimethoxy-2-phenylacetophenone, benzophenone, 1-hydroxycyclohexyl phenyl ketone, 2,4,6-trimethylol benzophenone, 4-methyl benzophenone, oligo-(2-hydroxyphenyl) propane, 2-benzyl-2-N,N-dimethylamino-1-(4-morpholino phenyl)-1-butane, 9,10-anthraquinone, 1-chloroanthraquinone, 2-chloroanthraquinone, 2-methylanthraquinone, 2-t-butylanthraquinone, octamethylanthraquinone, 1,4-naphthoquinone, 9,10-phenanthrenequinone, 1,2-benzanthraquinone, 2,3benzanthraquinone, 2-methyl-1,4-naphthoquinone, 2,3-dichloronaphthoquinone, 1,4-dimethylanthraquinone, 2,3-dimethylanthraquinone, 2-phenylanthraquinone, 2,3-diphenylanthraquinone, sodium salt of anthraquinone, α-sulfonic acid, 3-chloro-2-methylanthraquinone, retenequinone, 7,8,9,10-tetrahydronaphthacenequinone, and 1,2,3,4-tetrahydrobenz-α-anthracene-7,12-dione and mixtures thereof.

Other photoinitiators which are useful for the purpose of this invention are described in U.S. Pat. No. 2,760,863 and include vicinal ketaldonyl compounds such as diacetyl benzil, and the like, α-ketaldonyl alcohols, such as benzoin, pivaloin, and the like, α-hydrocarbon substituted aromatic acyloins, including α-methylbenzoin, α-allylbenzoin and α-phenylbenzoin and 2,2 dialkoxy-2-phenylacetophenone. Preferred photoinitiators are aromatic ketones and their mixtures, such as the benzophenones and substituted benzophenones. Particularly preferred photoinitiators are 2,2-dimethoxy-2-phenylacetophenone (ESACURE KB1, Sartomer Co., Exton, Pa.), 1-hydroxycyclohexyl phenyl ketone, 2,4,6-trimethylol benzophenone, 4-methyl benzophenone, oligo-(2-hydroxy-phenyl) propane, 2-benzyl-2-N,N-dimethylamino-1-(4-morpholino phenyl)-1-butane and mixtures thereof. A combination benzophenone and hydroxycyclohexyl phenyl ketone mixture (IRGACURE 500, Ciba-Geigy Corp., Hawthorne, N.Y.) and 2,4,6-trimethylol benzophenone, 4-methyl benzophenone and oligo-(2-hydroxy-phenyl)propane (ESACURE KT37) are most preferred.

The photosensitive elastomer composition is produced by mixing block copolymers with crosslinking photoinitiators at a sufficient concentration to initiate polymerization of the composition upon exposure to actinic radiation. Preferably, the concentration of photoinitiator ranges from about 0.1 to about 15 php. More preferably, the photoinitiator is used at a concentration of about 1 to about 15 php, most preferably about 1 to about 8 php.

Photopolymerizable, nongaseous, ethylenically unsaturated crosslinking agents may also be employed in the photosensitive composition. These crosslinking agents include unsaturated esters of polyols, particularly such esters with α-methylene carboxylic acids and the selection of a particular crosslinking agent may depend on the selected type of copolymer. Typical crosslinking agents used in the industry are described in the above incorporated U.S. Pat. No. 4,686,172 and include ethylene glycol diacrylate, diethylene glycol diacrylate, glycerol diacrylate, glycerol triacrylate, mannitol polyacrylate, sorbitol polyacrylate, ethylene glycol dimethacrylate, 1,3-propanediol dimethacrylate, 1,3, 4-butanetriol trimethacrylate, 1,4-butanediol diacrylate or dimethacrylate, 1,6-hexanediol diacrylate, 1,6-hexanediol dimethacrylate, 1,4-cyclohexanediol diacrylate, 1,4-benzenediol dimethacrylate, isosorbidene diacrylate, pentaerythritol di- tri- or tetramethacrylate or tetraacrylate, dipentaerythritol polyacrylate, 1,3-propanediol diacrylate, 1,6-hexanediol diacrylate or dimethacrylate, 1,5-pentanediol dimethacrylate, trimethylolpropane triacrylate and trimethacrylate, the bisacrylates and meth-acrylates of polyethylene glycols of 200 to 4000 molecular weight, unsaturated amides, particularly those of the α-methylene carboxylic acids and especially those of α, ω-diamines and oxygen-interrupted ω-diamines such as methylene bisacrylamide, methylene bismethacrylamide, ethylene bismethacrylamide, 1,6-hexamethylene bisacrylamide, diethylenetriamine trismethacrylamide, 1,2-di(γ-methacrylamidopropoxy)ethane, β-methacrylaminoethyl methacrylate,N-(β-hydroxyethyl)-2-(methacrylamido)ethyl acrylate and N,N-bis(β-methacryloxethy)acrylamide; vinyl esters such as divinyl succinate, divinyl adipate, divinylphthalate, divinyl tereptphalate, divinylbenzene-1,3-disulfonate, divinyl butane-1,4-disulfonate and unsaturated aldehydes, such as sorbaldehyde (hexadienal) and their mixtures. Preferred ethylenically unsaturated crosslinking agents are the esters and amides of α-methylene carboxylic acids and substituted carboxylic acids with polyols and polyamines, in which the molecular chain between the hydroxyls and amino groups is solely carbon or oxygen-interrupted carbon. Trimethylolpropane triacrylate, pentaerythritol triacrylate, mixed trifunctional acrylates (SARTOMER 519, Sartomer Co.), 1,6-hexanediol diacrylate, 1,6-hexanediol dimethacrylate, and mixtures thereof are preferred depending on the elastomeric copolymer used.

The amount of crosslinking agent used ranges from 0 to 20 php, depending on the photosensitive elastomer. For example, for the styrene-isoprene asymmetric, star-shaped elastomer, the preferred range of crosslinking agent is from 0 to about 1 php, while the styrene-isoprene-styrene triblock preferably requires at least 5 php crosslinking agent.

The photosensitive compositions described above are usually compounded with additional materials to improve resistance to thermal oxidation and ozone attack during manufacture, to improve processing and to reduce hardness of the finished printing plate, as well as pigments, fillers, and the like. Additives which impart resistance to thermal oxidation are well known in the art and include substituted phenols, such as p-methoxyphenol; alkylated phenols, such as 2,6-di-t-butyl-4-ethylphenol; alkylated phenols, such as 2-methylene-bis(4-methyl-6-butylphenol), 1,3,4-trimethyl-2,4,6-tris(3,5-di-t-butyl-4-hydroxybenzyl) benzene, 2(4-hydroxy-3,5-t-butylanilino)-4,6-bis(n-octylthio) 1,3,5-triazone, tetrakis(methylene(3,5-di-t-butyl-4-hydroxy hydrocinnamate)) methane; hydroquinones such as hydroquinone, and alkyl and aryl-substituted hydroquinones; p-toluquinone and chloranil; t-butylpyrocatechol, pyrogallol, β-naphtho-2,6-di-t-butyl-p-cresol; polymerized trimethyl dihydroquinone, naphtholamines, zinc dibutyl-dithiocarbamate and dilaurylthiodipropionate, phenothiazine, pyridine, nitrobenzene and dinitrobenzene.

Common antiozonants are microcrystalline wax and paraffin wax; ceresin wax; dibutyl thiourea; 1,1,3,3-tetramethyl-2-thiourea; bis-(1,2,3,6-tetrahydrobenzaldehyde); pentaerythritolacetal; norbornenes, for example, di-5-norbornene-2-methyl adipate, di-5-norbornene-2-methyl maleate, di-5-norbornene-2-methyl terephthalate; N-phenyl-2-napthylamine; polymers and resins, for example, ethylene-vinyl-acetate copolymer resin, chlorinated polyethylene, chlorosulfonated polyethylene, chlorinated-ethylene methacrylic acid copolymer, polyurethanes, polypentadienes, polybutadiene, furfural derived resins, ethylene-propylene-diene rubber and diethylene glycol ester of resin and α-methylsytrene-vinyltoluene copolymer.

Conventional processing aids and softening additives may also be used. They include naphthenic and paraffinic oils and other hydrocarbon oils, polymers and resins for instance, α-methylstyrene-vinyltoluene copolymers, pentaerythritol ester of hydrogenated rosin, polyterpene resins, ester resins, polyethylene, poly-α-methyl styrene, polyacrylates and other polymers and resins and stearic acid.

Polymeric plasticizers may be used if compatible with the block copolymers of the present invention. These additives are well known in the art and include liquid polybutadiene, liquid polyisoprene, liquid polybutadiene/styrene copolymer, depolymerized polybutadiene, depolymerized polyisoprene, depolymerized natural rubber, and the like. Preferably, a plasticizer is used in amounts up to about 40 php, more preferably in amounts up to about 30 php and most preferably in amounts up to about 20 php.

Colorants, such as methyl violet, methyl red and rose bengal, can be used, providing they neither interfere with the absorption of the actinic radiation nor inhibit photopolymerization.

The photosensitive composition can contain fillers or reinforcing agents that do not scatter actinic radiation and are preferably transparent. Suitable fillers are immiscible polymeric or nonpolymeric organic or inorganic materials, such as polystyrene, organophilic silicas, bentonites, silica, powdered glass, zinc stearate, and the like.

These photosensitive compositions can be produced in any manner known in the industry. The various components may be blended homogeneously in, for example, solution mixers, open mills, internal mixers or compounding extruders. The photosensitive composition can be formed into sheets from about 0.0005 to about 0.300 inches thick (0.013–7.62 mm) by any method known in the art, for example, solvent casting, hot pressing, calendaring or extrusion at room or elevated temperatures. The crosslinked photosensitive sheets have a hardness within the range of about 15 to about 70 Shore A hardness, preferably within the range of about 25 to about 60 Shore A, especially preferred is about 28 to 50 Shore A.

Photosensitive elements of the invention are usually made by affixing the sheets of the photosensitive composition to support means, usually by adhering, laminating or directly coating to the support means. The support means of the invention is unaffected by washout solvents and typically includes metals, for example, steel, tin and aluminum plates, sheets and foils as well as films or plates composed of various film-forming synthetic resins, for example, addition polymers and linear condensation polymers such as polyamide and polyester. Preferred support means include transparent polyester films, such as polyethylene terephthalate, and are typically from 0.001 to 0.020 inch (0.025–0.051 mm) and preferably 0.004–0.006 inch (0.010–0.015 cm) thick. The support means can include a single support, a support with several layers of materials or multiple support layers.

To prevent excessive reflection of actinic radiation into the unexposed regions of the photosensitive layer, the support means may also contain actinic radiation absorbing materials to eliminate actinic radiation reflection. The absorbing materials can be incorporated within a substrate of the support means, such as a dyed metal plate or polyester film, or layered onto a substrate. This absorbing or antihalation layer can be made by dispersing UV stabilizers, such as UV absorbers, organic dyes or pigments, or light quenchers in a solution or aqueous dispersion of a resin or polymer that adheres to both the support and the photosensitive composition sheet. Suitable absorbing layer materials include benzophenones, benzotriazoles, oxalanilides, pigments such as carbon black, manganese dioxide, dyes and nickel chelates. Suitable polymeric or resin carriers include polyvinyl compounds, for example, polyvinyl chloride homopolymers and copolymers, such as, vinyl chloride with vinyl acetate, diethyl fumarate, ethyl acrylate and copolymers of acrylic and methacrylic acid.

If an absorbing layer is used, it is preferably sandwiched between the support means and the photosensitive composition sheet. The layer is coated onto the support means and dried. The photosensitive composition sheet is then attached to the support means in any conventional manner. The absorbing layer must therefore adhere both to the support and the photosensitive composition sheet, while not interfering with the crosslinking of the photosensitive composition.

The top of the photosensitive element is preferably protected with a thin, solvent removable coating usually paired with a cover sheet. The coating is applied to the photosensitive sheet's top surface opposite the support means. This coating is a very thin (about 0.0002 inch thick) layer of a flexible, transparent, protective release film that is subsequently removed during washout, for instance, polyamide copolymers, vinyl acetate copolymers, copolymers of polyethylene and polyvinyl acetate, and the like. Other agents can also be used, such as silicone, fluorocarbons and waxes, if they are transparent and do not interfere with exposure to actinic radiation. These release films promote close contact between the element's top surface and the image bearing negative or transparency applied to the element. The close contact enhances the accuracy of the reproduction of the image on the element.

The top layer may be further protected by a cover sheet. The cover sheet is a layer of strippable sheet film placed over the coating. Examples of such films include polystyrene, polyethylene, polypropylene, polyethylene terephthalate, and the like.

If desired, the photosensitive element of the invention may be back exposed, that is, exposed to actinic radiation through the support means to crosslink the non-relief backing area of a thick photosensitive sheet. This exposure controls the relief depth and presensitizes the photosensitive layer.

In normal use, a black and white transparency or negative containing the subject matter to be printed is placed on top of the photosensitive element after first stripping off any cover sheet and after any desired back exposure. A vacuum system is usually used to provide intimate contact between the negative and the surface. The element is then exposed to actinic radiation. On exposure, the transparent areas of the negative allow actinic radiation to penetrate and initiate addition polymerization or crosslinking. The opaque areas block out the radiation and allow the material under them to remain uncrosslinked. Exposure is of sufficient duration to crosslink the image down to the support means or to the back exposed crosslinked layer. For good results, crosslinking occurs only in the exposed areas of the sheet with no significant crosslinking occurring in the non-image, unexposed areas.

Actinic radiation may be provided from any light source at 200–600 nm and a wattage of 10 to 1000 watts, such as sunlight, phosphorescent discharge lamps (fluorescent lamps), carbon arc lamps, metal arc lamps such as low, medium or high pressure mercury lamps, xenon lamps, argon lamps, tungsten lamps and metal halide lamps. Preferred sources are metal arc lamps, especially high pressure mercury lamps, such as the very high output so-called black-light fluorescent types due to their high ratio of ultraviolet to infrared output. Exposure times may vary, depending on the photospeed of the photopolymerizable material, output of the lamps, distance from the lamps, the relief depth desired and the thickness of the plate.

After exposure, the uncrosslinked portions of the plate are dissolved away with any suitable solvent known in the art, leaving a flexible printing plate. Examples of suitable solvents include 2-butanone, benzene, toluene, xylene, trichloroethane, trichloroethylene, tetrachloroethylene, methylchloroform, and solvent mixtures such as tetrachloroethylene and n-butanol, and other solvents known in the art. The washed plate is then dried and post treated.

Post treatments include detackification and post exposure, either simultaneously or in any order, and are well known in the art. Detackification can be accomplished by temporary or permanent methods. Temporary methods include dusting with fine powders such as talc or cornstarch or coating with nonsilicone release fluids. Permanent methods involve the immersion of the element in an aqueous solution containing chlorine, bromine or iodine, or exposure of the element to actinic radiation at about 253 nm that is produced by germicidal lamps. Post exposure involves exposing the printing element to a black light to ensure complete photopolymerization, crosslinking and final plate hardening. Both the germicidal and blacklight lamps can be fitted into a single exposure unit for simultaneous treatment.

The resultant developed elements of the invention exhibit resistance to a wide variety of printing ink solvents normally used in flexographic printing, including water, alcohols such as ethanol or 2-propanol, 2-butoxy-ethoxyethanol, 2-ethoxyethanol, 2-propyl acetate, ketones, esters and their mixtures. These materials resist swelling and hardness changes after prolonged exposure in typical ink solvents, indicating an excellent durability.

The following examples are illustrative of the present invention and are not intended as a limitation upon the scope thereof.

EXAMPLE 1

Photosensitive elastomer compositions for runs 1 through 4 were prepared on a 12×6 in., 2-roll mill that was heated to 120° C. by steam. The compositions used are described in Table 1, with all components in php.

TABLE 1

| Run No. | 1 | 2 | 3 | 4 |
| --- | --- | --- | --- | --- |
| Block Copolymer A[1] | 100 | 100 | 100 | 100 |
| Antioxidant[2] | 0.05 | 0.05 | 0.05 | 0.05 |
| Dye[3] | 0.005 | 0.005 | 0.005 | 0.005 |
| Antiozonant[4] | 1.0 | 1.0 | 1.0 | 1.0 |
| Wax[5] | 1.0 | 1.0 | 1.0 | 1.0 |
| Processing Additive[6] | 5.0 | 5.0 | 5.0 | 5.0 |
| Photoinitiator[7] | 2.0 | 2.0 | 2.0 | 2.0 |
| Crosslinking Agent A[8] | 1.0 | 1.0 | 1.0 | 1.0 |
| UV Absorber A[9] | 0 | 0.1 | 0 | 0 |
| UV Absorber B[10] | 0 | 0 | 0.1 | 0 |
| UV Absorber C[11] | 0 | 0 | 0 | 0.1 |

[1]. Block copolymer A: asymmetric star-shaped styreneisoprene, block copolymer. Styrene/isoprene ratio: 10/90, specific gravity: 0.93, Shore A hardness of polymer: 32, weight average molecular weight about 1.2 million. Kraton ® D-1320 X (Shell)
[2]. Tetrakis (methylene (3,5-di-t-butyl-4-hydroxy hydrocinnamate)) methane
[3]. Methyl violet
[4]. Bis-(1,2,3,6-tetrahydrobenzaldehyde) pentaerythritolacetal, VULKAZON AFS/LG, MOBAY Chemicals, Pittsburgh, PA.
[5]. Mixed microcrystalline/paraffin wax, SUNPROOF JR Wax, Uniroyal Chemical Co., Middlebury, CT.
[6]. α-methylstyrene/vinyltoluene copolymer
[7]. 2,2-dimethoxy-2-phenylacetophenone
[8]. (1,6)-hexanediol diacrylate
[9]. A mixture of poly(oxy-1,2-ethanediyl), α-((3-(3-(2H-benzotriazole-2-yl)-5-(1,1-dimethyl-ethyl)-4-hydroxyphenyl)-1-oxopropyl)-ω-hydroxy; poly(oxy-1,2-ethanediyl), α-((3-(3-(2H-benzotriazole-2-yl)-5-(1,1-dimethyl-ethyl)-4-hydroxyphenyl)-1-oxopropyl)-ω-(3-(3-(2H-benzotriazole-2-yl)-5-(1,1-dimethyl-ethyl)-4-hydroxyphenyl)-1-oxopropoxy) and polyethylene glycol (300 Mw) (TINUVIN 1130, Ciba-Geigy)
[10]. 2,4-dihydroxybenzophenone (SYNTASE 100, Great Lakes Chemical)
[11]. 2-(2-hydroxy-5-t-octophenyl) benzotriazole (CYASORB UV5411, American Cyanamid Co.)

The block copolymer was first added to the mill and worked until an even band of copolymer formed around one roll. The antioxidant was then added and blended in with the copolymer, followed by the dye, antiozonant, wax and processing additive. Next, the photoinitiator was added and blended in followed by the crosslinking agent. Finally, the blended photosensitive composition was sheeted off the rolls at approximately 3–4 mm thick.

A photosensitive, flexographic plate element was formed by pressing about a 100 gram sample between two sheets of 0.13 mm polyester film. The cover sheet was treated with a dry film release while a second untreated sheet of polyester film formed the support sheet. The plate was heated in a steam heated press at 120° C. for 10 minutes under pressure. The press was then cooled to room temperature, and the sample removed. The sample was about 2.5 to 2.6 mm thick. The cover sheet was removed and the surface of the sample was sprayed with the release compound used on the cover sheet.

The plates were tested by exposure through the back to determine the exposure time to ultraviolet light required to form a desirable relief depth in the finished plate. Back exposure tests were carried out on samples of the plate cut from the pressed sheets. Samples were exposed in sections in 1 minute steps for up to 6 minutes in an exposure unit using UV lamps (Philips F15T8/BL) 5 cm apart placed 5 cm above the plate surface.

After back exposure, the samples were washed for 15 minutes in a rotary brush plate wash unit using a tetrachloroethylene (75%)/n-butanol (25%) solution, then dried for 2 hours at 60° C. followed by 16 hours at room temperature. The thickness of the polymer coating remaining on the polyester support was measured with a micrometer with the results summarized in Table 2.

TABLE 2

RESULTS

| Exposure Time | Run No. | | | |
| --- | --- | --- | --- | --- |
| | 1 | 2 | 3 | 4 |
| | Thickness of polymer coating (mm) remaining on polyester support layer | | | |
| 1 Min | 1.65 | 0.64 | 1.07 | 0.58 |
| 2 Min | 2.16 | 0.84 | 1.50 | 0.79 |
| 3 Min | 2.54 | 1.07 | 1.75 | 0.99 |
| 4 Min | 2.62 | 1.12 | 2.01 | 1.12 |
| 5 Min | 2.67 | 1.32 | 2.21 | 1.27 |
| 6 Min | 2.74 | 1.42 | 2.39 | 1.42 |

For Examples 1 through 4, further samples were back exposed to yield a printing relief of about 1 mm. A test negative was placed on the surface of the sample opposite the support layer and held in intimate contact with the surface using a transparent plastic film under vacuum. The test negative contained images that included percentage calibrated screen tints, fine and coarse type, and line and dot on both relief and intaglio. The sample was then step-wise exposed in one thirds to UV light through the negative for 10, 20 and 30 minutes.

After the step-wise face exposure, the plate samples were washed for 6 minutes in a rotary brush plate wash unit using a tetrachloroethylene (75%)/n-butanol (25%) solution to remove uncrosslinked material. The washed sample was dried for 2 hours at 60° C. followed by 16 hours at room temperature. Post treatment consisted of exposure to a germicidal lamp for 7 minutes and then exposure to black light for 5 minutes.

Although Runs No. 1–4 had a 38 Shore A hardness, their photospeed and exposure latitude differed. Runs No. 1 and 3 had commercially acceptable photospeed. Run No. 1 retained all the detail at 20 minutes, but had significant reduction depth in the intaglio at the 30 minutes exposure. Run No. 3 had a much improved depth in the intaglio at 30 minutes while also holding fine detail at 20 minutes, indicating greater exposure latitude.

Runs No. 2 and 4 had slower photospeed than Runs No. 1 and 3, with Run No. 4 slower than Run No. 2. After a 30 minute exposure, Runs No. 2 and 4 were missing a few 0.2 mm isolated dots and had a slightly unstable 0.17 mm isolated line. The depth in intaglio for both runs was very good for all exposure times, thus illustrating their improved exposure latitude.

EXAMPLE 2

The photosensitive compositions for runs 5 through 8 were prepared as in Example 1 with the components in php as described in Table 3.

TABLE 3

| Run No. | 5 | 6 | 7 | 8 |
|---|---|---|---|---|
| Block Copolymer B[1] | 100 | 100 | 100 | 100 |
| Antioxidant[2] | 0.05 | 0.05 | 0.05 | 0.05 |
| Dye[2] | 0.005 | 0.005 | 0.005 | 0.005 |
| Antiozonant[2] | 1.0 | 1.0 | 1.0 | 1.0 |
| Wax[2] | 1.0 | 1.0 | 1.0 | 1.0 |
| Processing Additive[2] | 5.0 | 5.0 | 5.0 | 5.0 |
| Photoinitiator[2] | 2.0 | 2.0 | 2.0 | 2.0 |
| Crosslinking Agent A[3] | 6.0 | 6.0 | 6.0 | 6.0 |
| Crosslinking Agent B[4] | 1.0 | 1.0 | 1.0 | 1.0 |
| UV Absorber A[2] | 0 | 0.1 | 0 | 0 |
| UV Absorber B[2] | 0 | 0 | 0.1 | 0 |
| UV Absorber C[2] | 0 | 0 | 0 | 0.1 |

[1]. Block copolymer B: linear styrene-isoprene-styrene block copolymer. Styrene/isoprene ratio: 14/86, specific gravity: 0.92, Shore A hardness of polymer: 37, weight average molecular weight about 100,000. Kraton® D-1107 (Shell).
[2]. Same as in Example 1
[3]. 1,6-hexanediol diacrylate
[4]. 1,6-hexanediol dimethacrylate These compositions were tested for back exposure properties as described in Example 1 with the results summarized in Table 4.

TABLE 4

RESULTS

| | Run No. | | | |
|---|---|---|---|---|
| | 5 | 6 | 7 | 8 |
| Back exposure time - Thickness in polymer layer (mm) | | | | |
| 1 min | 1.80 | 0.76 | 1.12 | 0.58 |
| 2 min | 2.26 | 0.97 | 1.47 | 0.91 |
| 3 min | 2.41 | 1.24 | 1.65 | 1.09 |
| 4 min | X | 1.35 | 1.83 | 1.24 |
| 5 min | X | 1.45 | 1.93 | 1.37 |
| 6 min | X | 1.52 | 2.01 | 1.48 |

X totally crosslinked to the surface.

Samples from Runs No. 5–8 were further exposed and processed as in Example 1. Run No. 5 with no UV absorber had a very fast photospeed, whereas Runs No. 6–8 showed a commercially acceptable photospeed. The details of the sample from Run No. 5 were held after the 10 minutes exposure, but considerable fill-in occurred after 20 minutes exposure. Run No. 6 was slow even at 30 minutes exposure, although the depth of intaglio was excellent. The 0.2 mm isolated dots were lost and the 0.13 mm isolated line was unstable. The plate from Run No. 7 had good photospeed, with some fill-in after 20 minutes exposure. The exposure latitude of the plate from Run No. 7 was superior to that of Run No. 5. Run No. 8 plates had slower photospeeds than plates from Run No. 6, as well as unstable 0.17 mm lines and loss of 0.25 mm dots after 30 minutes of exposure. The Shore A hardness of all of the plates was 50. The results from Runs No. 6 and 8 illustrate the case where too high a level of UV absorber can excessively slow the photopolymerization reaction.

EXAMPLE 3

The following polymer compositions were made using the procedure described in Example 1, with the components in php as described in Table 5.

TABLE 5

| Run No. | 9 | 10 | 11 | 12 |
|---|---|---|---|---|
| Block Copolymer C[1] | 100 | 100 | 100 | 100 |
| Antioxidant[2] | 0.05 | 0.05 | 0.05 | 0.05 |
| Dye[2] | 0.005 | 0.005 | 0.005 | 0.005 |
| Antiozonant[2] | 1.0 | 1.0 | 1.0 | 1.0 |
| Wax[2] | 1.0 | 1.0 | 1.0 | 1.0 |
| Processing Additive[2] | 5.0 | 5.0 | 5.0 | 5.0 |
| Photoinitiator[2] | 2.0 | 2.0 | 2.0 | 2.0 |
| Crosslinking Agent C[3] | 1.0 | 1.0 | 1.0 | 1.0 |
| UV Absorber A[2] | 0 | 0.1 | 0 | 0 |
| UV Absorber B[2] | 0 | 0 | 0.1 | 0 |
| UV Absorber C[2] | 0 | 0 | 0 | 0.1 |

[1]Block Copolymer C: symmetric, radial, styreneisoprene block copolymer. Styrene/isoprene ratio: 16/84, specific gravity: 0.92, Shore A hardness of polymer: 38, weight average molecular weight about 170,000. SOL TE 9110 (Enichem Elastomers)
[2]Same as in Example 1
[3]Trimethylolpropane triacrylate Samples were produced and tested for back exposure properties as described in Example 1, with the results summarized in Table 6.

TABLE 6

RESULTS

| | Results: Run No. | | | |
|---|---|---|---|---|
| | 9 | 10 | 11 | 12 |
| Back exposure time - Thickness in polymer layer (mm) | | | | |
| 1 min | 1.40 | 0.61 | 1.02 | 0.46 |
| 2 min | 1.88 | 0.86 | 1.42 | 0.64 |
| 3 min | 2.21 | 0.91 | 1.63 | 0.81 |
| 4 min | 2.30 | 1.12 | 1.83 | 1.99 |
| 5 min | X | 1.22 | 2.01 | 1.12 |
| 6 min | X | 1.34 | 2.13 | 1.19 |

X totally crosslinked to the surface.

Samples from Runs No. 9–12 were further exposed and processed as in Example 1. Runs No. 9, 10 and 11 of Example 3 exhibited commercially acceptable photospeed. Run No. 9 without a UV absorber showed fill-in in the intaglio after 20 minutes exposure. Runs No. 10 and 11, however, had excellent exposure latitude, with detail very sharp and clean with no fill-in in the intaglio even after 30 minutes of exposure. Run No. 12 was slower than the other plates. There was some instability in 0.17 mm isolated line and the 0.13 mm isolated dots were not held after 30 minutes, indicating too high a level of UV absorber in this composition. The Shore A hardness of these photosensitive compositions was 45.

EXAMPLE 4

The following photosensitive compositions were made and tested using the procedures in Example 1, with the components in php described in Table 7. Runs No. 13 and 14 were then compared with Runs No. 1 and 2 with the back exposure results summarized is Table 8. Samples from Runs No. 13 and 14 were further exposed and processed as in Example 1.

TABLE 7

| Run No. | 1 | 2 | 13 | 14 |
|---|---|---|---|---|
| Block Copolymer A[1] | 100 | 100 | 100 | 100 |

TABLE 7-continued

| Run No. | 1 | 2 | 13 | 14 |
|---|---|---|---|---|
| Antioxidant[2] | 0.05 | 0.05 | 0.05 | 0.05 |
| Dye[2] | 0.005 | 0.005 | 0.005 | 0.005 |
| Antiozonant[2] | 1.0 | 1.0 | 1.0 | 1.0 |
| Wax[2] | 1.0 | 1.0 | 1.0 | 1.0 |
| Processing Additive[2] | 5.0 | 5.0 | 5.0 | 5.0 |
| Photoinitiator[2] | 2.0 | 2.0 | 2.0 | 2.0 |
| Crosslinking Agent[2] | 1.0 | 1.0 | 1.0 | 1.0 |
| UV Absorber A[3] | 0 | 0.1 | 0.06 | 0.03 |

[1]. Block copolymer A: asymmetric star shaped styreneisoprene, block copolymer
[2]. Same as in Example 1
[3]. TINUVIN 1130 (Ciba-Geigy)

TABLE 8

RESULTS

| | Run No. | | |
|---|---|---|---|
| 1 | 2 | 13 | 14 |

Back exposure time - Thickness in polymer layer (mm)

| 1 min | 1.65 | 0.64 | 0.83 | 1.27 |
|---|---|---|---|---|
| 2 min | 2.16 | 0.84 | 1.17 | 1.65 |
| 3 min | 2.54 | 1.07 | 1.40 | 1.90 |
| 4 min | 2.62 | 1.12 | 1.50 | 2.08 |
| 5 min | 2.67 | 1.32 | 1.65 | 2.21 |
| 6 min | 2.74 | 1.42 | 1.73 | 2.31 |

As in Example 1, the plate sample from Run No. 1 was too fast and the sample from Run No. 2 was too slow. Run No. 14 had a commercially acceptable photospeed and excellent exposure latitude. All of the detail was complete at 20 minutes exposure, and there was very little loss of depth in the intaglio when exposure increased to 30 minutes. The Run No. 13 sample was similar in photospeed to Run No. 1. This sample, however, had even less fill-in in the intaglio at 30 minutes exposure than Run No. 14, thus showing excellent exposure latitude. All samples had a Shore A hardness of 38.

The results from these Examples show that there are optimum amounts of UV absorber for each photosensitive composition, depending on the polymer crosslinking agent and photoinitiator used. As shown above, such optimum levels are readily ascertained by simple experimentation.

EXAMPLE 5

The following photosensitive compositions in Table 9 illustrate the efficacy of a UV absorber to enhance the exposure latitude of the compositions with the asymmetric, star-shaped block copolymer A without a crosslinking agent. The compositions were prepared and tested as described in Example 1 with all components in php.

TABLE 9

| Run No. | 15 | 16 | 17 |
|---|---|---|---|
| Block Copolymer A[1] | 100 | 100 | 100 |
| Antioxidant[2] | 0.05 | 0.05 | 0.05 |
| Dye[2] | 0.005 | 0.005 | 0.005 |
| Antiozonant[2] | 1.0 | 1.0 | 1.0 |
| Wax[2] | 1.0 | 1.0 | 1.0 |
| Processing Additive[2] | 5.0 | 5.0 | 5.0 |

TABLE 9-continued

| Run No. | 15 | 16 | 17 |
|---|---|---|---|
| Photoinitiator[2] | 1.0 | 1.0 | 1.0 |
| Crosslinking Agent | 0 | 0 | 0 |
| UV Absorber A[3] | 0 | 0.06 | 0.03 |

[1]. Block copolymer A: asymmetric star shaped styreneisoprene, block copolymer
[2]. Same as in Example 1
[3]. TINUVIN 1130 (Ciba-Geigy)

The samples were produced and tested for back exposure time as described in Example 1. Further samples of Runs No. 15–17 were then face exposed and processed as described in Example 1.

The back exposure time for Run No. 15 was 6 minutes and for Runs No. 16 and 17 was 10 minutes. The detail retained by all of the plates was similar, but there was less fill-in in the intaglio in the plates from Runs No. 16 and 17 when compared with Run No. 15. All samples had a Shore A hardness of 33.

As this Example shows, the addition of an effective amount of UV absorber to a photosensitive composition based on the asymmetric, star-shaped block copolymer without a crosslinking agent improves the exposure latitude.

EXAMPLE 6

A photosensitive composition (Run No. 18) was made and tested as in Example 1 using the composition of Run No. 13 of Example 4, with the exception of the addition of 10.0 php liquid polybutadiene, number average molecular weight of 1,300, 70% (1,2)-vinyl content. Run No. 18 was then compared with Runs No. 1 and 13, with the back exposure results summarized in Table 10.

TABLE 10

RESULTS

| | Run No. | |
|---|---|---|
| 1 | 13 | 18 |

Back exposure time - Thickness in polymer layer (mm)

| 1 min | 1.65 | 0.83 | 0.97 |
|---|---|---|---|
| 2 min | 2.16 | 1.17 | 1.32 |
| 3 min | 2.54 | 1.40 | 1.57 |
| 4 min | 2.62 | 1.50 | 1.75 |
| 5 min | 2.67 | 1.65 | 1.98 |
| 6 min | 2.74 | 1.73 | 2.06 |

The photospeed and exposure latitude of plates from Runs No. 13 and 18 were similar, having commercially acceptable photospeed and excellent exposure latitude. The plate from Run No. 18 was softer and more flexible than the plate from Run No. 13, having a 30 Shore A hardness compared to a 38 Shore A hardness for Runs No. 1 and 13 plates.

These Examples demonstrate that in effective amounts, the addition of UV absorbers to the photosensitive compositions of the invention increases the exposure latitude without adversely affecting the physical properties or the photochemical properties of the resultant printing plates. The photosensitive compositions have utility in raised image printing processes such as letterpress, letterset and flexographic printing. Printing elements of the invention render high quality images on many surfaces, including very rough surfaces, such as corrugated cardboard, metals and plastic foils.

While the invention is shown in several forms, it is not thus limited but is susceptible to various changes and modifications without departing from the spirit and scope of the invention.

What is claimed is:

1. In a process for making a printing plate, the process comprising the steps of:

(a) imagewise exposing to actinic radiation a photosensitive printing element comprising support means having thereon a layer of a photosensitive composition;

(b) removing the unexposed portions of the imagewise exposed layer with a solvent to form a printing plate; and (c) post development treating the printing plate; wherein the improvement comprises using a photosensitive composition comprising a crosslinking photointiator; a thermoplastic, elastomeric, asymmetric, star-shaped block copolymer having an asymmetric, star-shaped structure

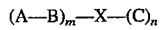

wherein

A is a polymer block of a monoalkenyl arene,
B is a polymer block of a conjugated diene,
C is a polymer block of a conjugated diene,
X is the residue of a multi-functional coupling agent,
$3 < m+n \leq 40$, the weight average molecular weight of each block A is between about 3,000 and about 125,000 and the weight average molecular weight of each block B and block C is between about 15,000 and about 250,000; a limited amount of an ethylenically unsaturated, crosslinking agent, the ethylenically unsaturated, crosslinking agent being present in the range from 0 to about 1 part by weight per hundred parts by weight asymmetric, star-shaped block copolymer; and an actinic radiation absorber evenly distributed throughout the photosensitive composition to enhance the exposure latitude of the photosensitive composition.

2. In a process for making a printing plate, the process comprising the steps of:

(a) imagewise exposing to actinic radiation a photosensitive printing element comprising support means having thereon a layer of a photosensitive composition;

(b) removing the unexposed portions of the imagewise exposed layer with a solvent to form a printing plate; and (c) post development treating the printing plate; wherein the improvement comprises using a photosensitive composition comprising a crosslinking photointiator; a thermoplastic, elastomeric, asymmetric, star-shaped block copolymer having an asymmetric, star-shaped structure

wherein

A is a polymer block of a monoalkenyl arene,
B is a polymer block of a conjugated diene,
C is a polymer block of a conjugated diene,
X is the residue of a multi-functional coupling agent,
$3 < m+n \leq 40$, the weight average molecular weight of each block A is between about 3,000 and about 125,000 and the weight average molecular weight of each block B and block C is between about 15,000 and about 250,000; a limited amount of an ethylenically unsaturated, crosslinking agent, the ethylenically unsaturated, crosslinking agent being present in the range from 0 to about 1 part by weight per hundred parts by weight asymmetric, star-shaped block copolymer; and an actinic radiation absorber evenly distributed throughout the photosensitive composition to enhance the exposure latitude of the photosensitive composition, the actinic radiation absorber being present in the range from 0.001 to about 1 part by weight per hundred parts by weight asymmetric, star-shaped block copolymer.

* * * * *